United States Patent
Trindade et al.

(10) Patent No.: US 10,832,934 B2
(45) Date of Patent: Nov. 10, 2020

(54) MULTI-LAYER TETHERS FOR MICRO-TRANSFER PRINTING

(71) Applicant: X Display Company Technology Limited, Dublin (IE)

(72) Inventors: António José Marques Trindade, Cork (IE); Christopher Andrew Bower, Raleigh, NC (US)

(73) Assignee: X Display Company Technology Limited, Dublin (IE)

( * ) Notice: Subject to any disclaimer, the term of this patent is extended or adjusted under 35 U.S.C. 154(b) by 0 days.

(21) Appl. No.: 16/008,945

(22) Filed: Jun. 14, 2018

(65) Prior Publication Data
US 2019/0385885 A1    Dec. 19, 2019

(51) Int. Cl.
*H01L 21/683* (2006.01)
*H01L 21/56* (2006.01)
(Continued)

(52) U.S. Cl.
CPC ...... *H01L 21/6835* (2013.01); *B41F 16/0046* (2013.01); *H01L 21/561* (2013.01); *H01L 24/97* (2013.01); *H01L 2221/68322* (2013.01); *H01L 2221/68363* (2013.01); *H01L 2221/68381* (2013.01); *H01L 2224/95001* (2013.01)

(58) Field of Classification Search
None
See application file for complete search history.

(56) References Cited

U.S. PATENT DOCUMENTS

| | | | |
|---|---|---|---|
| 3,673,471 A | 6/1972 | Klein et al. | |
| 5,475,224 A | 12/1995 | Koh | |

(Continued)

FOREIGN PATENT DOCUMENTS

| | | | |
|---|---|---|---|
| JP | 2005108943 A | 4/2005 | |
| JP | 2005259912 A | 9/2005 | |

(Continued)

OTHER PUBLICATIONS

Cok, R. S. et al., AMOLED displays with transfer-printed integrated circuits, Journal of the SID, 19(4):335-341, (2011).

(Continued)

*Primary Examiner* — Bradley Smith
(74) *Attorney, Agent, or Firm* — William R. Haulbrook; Michael D. Schmitt; Choate, Hall & Stewart LLP

(57) ABSTRACT

A micro-device structure comprises a source substrate comprising sacrificial portions laterally spaced apart by anchors. Each sacrificial portion is exposed through an opening. A micro-device is disposed on each sacrificial portion and laterally attached to an anchor by a multi-layer tether. In certain embodiments, a micro-device structure is constructed by providing the source substrate, disposing micro-devices on each sacrificial portion, depositing a first tether layer over at least a portion of the source substrate and the micro-device, depositing a second tether layer over the first tether layer, and patterning the first tether layer and the second tether layer to form (i) a multi-layer tether for each of the micro-devices such that the multi-layer tether laterally attaches the micro-device to one of the anchors, and (ii) an opening exposing each of the sacrificial portions.

24 Claims, 11 Drawing Sheets

(51) Int. Cl.
  *H01L 23/00* (2006.01)
  *B41F 16/00* (2006.01)

(56) References Cited

U.S. PATENT DOCUMENTS

| | | | |
|---|---|---|---|
| 5,621,555 A | 4/1997 | Park | |
| 5,815,303 A | 9/1998 | Berlin | |
| 5,882,532 A | 3/1999 | Field et al. | |
| 6,051,472 A | 4/2000 | Abiko et al. | |
| 6,142,358 A | 11/2000 | Cohn et al. | |
| 6,278,242 B1 | 8/2001 | Cok et al. | |
| 6,577,367 B2 | 6/2003 | Kim | |
| 6,717,560 B2 | 4/2004 | Cok et al. | |
| 6,756,576 B1 | 6/2004 | McElroy et al. | |
| 6,933,532 B2 | 8/2005 | Arnold et al. | |
| 7,129,457 B2 | 10/2006 | McElroy et al. | |
| 7,195,733 B2 | 3/2007 | Rogers et al. | |
| 7,288,753 B2 | 10/2007 | Cok | |
| 7,354,801 B2 | 4/2008 | Sugiyama et al. | |
| 7,399,693 B2 | 7/2008 | Sekiguchi et al. | |
| 7,521,292 B2 | 4/2009 | Rogers et al. | |
| 7,557,367 B2 | 7/2009 | Rogers et al. | |
| 7,586,497 B2 | 9/2009 | Boroson et al. | |
| 7,622,367 B1 | 11/2009 | Nuzzo et al. | |
| 7,662,545 B2 | 2/2010 | Nuzzo et al. | |
| 7,704,684 B2 | 4/2010 | Rogers et al. | |
| 7,799,699 B2 | 9/2010 | Nuzzo et al. | |
| 7,816,856 B2 | 10/2010 | Cok et al. | |
| 7,893,612 B2 | 2/2011 | Cok | |
| 7,927,976 B2 | 4/2011 | Menard | |
| 7,932,123 B2 | 4/2011 | Rogers et al. | |
| 7,943,491 B2 | 5/2011 | Nuzzo et al. | |
| 7,972,875 B2 | 7/2011 | Rogers et al. | |
| 7,982,296 B2 | 7/2011 | Nuzzo et al. | |
| 7,999,454 B2 | 8/2011 | Winters et al. | |
| 8,029,139 B2 | 10/2011 | Ellinger et al. | |
| 8,039,847 B2 | 10/2011 | Nuzzo et al. | |
| 8,198,621 B2 | 6/2012 | Rogers et al. | |
| 8,207,547 B2 | 6/2012 | Lin | |
| 8,261,660 B2 | 9/2012 | Menard | |
| 8,333,860 B1 | 12/2012 | Bibl et al. | |
| 8,334,545 B2 | 12/2012 | Levermore et al. | |
| 8,394,706 B2 | 3/2013 | Nuzzo et al. | |
| 8,440,546 B2 | 5/2013 | Nuzzo et al. | |
| 8,470,701 B2 | 6/2013 | Rogers et al. | |
| 8,502,192 B2 | 8/2013 | Kwak et al. | |
| 8,506,867 B2 | 8/2013 | Menard | |
| 8,664,699 B2 | 3/2014 | Nuzzo et al. | |
| 8,686,447 B2 | 4/2014 | Tomoda et al. | |
| 8,722,458 B2 | 5/2014 | Rogers et al. | |
| 8,754,396 B2 | 6/2014 | Rogers et al. | |
| 8,766,970 B2 | 7/2014 | Chien et al. | |
| 8,779,484 B2 | 7/2014 | Shen et al. | |
| 8,791,474 B1 | 7/2014 | Bibl et al. | |
| 8,794,501 B2 | 8/2014 | Bibl et al. | |
| 8,803,857 B2 | 8/2014 | Cok | |
| 8,817,369 B2 | 8/2014 | Daiku | |
| 8,835,940 B2 | 9/2014 | Hu et al. | |
| 8,854,294 B2 | 10/2014 | Sakariya | |
| 8,877,648 B2 | 11/2014 | Bower et al. | |
| 8,889,485 B2 | 11/2014 | Bower | |
| 8,895,406 B2 | 11/2014 | Rogers et al. | |
| 8,934,259 B2 | 1/2015 | Bower et al. | |
| 8,987,765 B2 | 3/2015 | Bibl et al. | |
| 9,142,468 B2 | 9/2015 | Bower et al. | |
| 9,161,448 B2 | 10/2015 | Menard et al. | |
| 9,355,854 B2 | 5/2016 | Meitl et al. | |
| 9,368,683 B1 * | 6/2016 | Meitl | H01L 33/26 |
| 9,434,150 B2 | 9/2016 | Bower et al. | |
| 9,520,537 B2 | 12/2016 | Bower et al. | |
| 9,589,944 B2 | 3/2017 | Higginson et al. | |
| 9,601,356 B2 | 3/2017 | Bower et al. | |
| 9,923,133 B2 | 3/2018 | Bower et al. | |
| 9,929,053 B2 | 3/2018 | Bower et al. | |
| 9,947,584 B2 | 4/2018 | Bower et al. | |
| 2003/0062580 A1 | 4/2003 | Sato et al. | |
| 2003/0141570 A1 | 7/2003 | Chen et al. | |
| 2006/0063309 A1 | 3/2006 | Sugiyama et al. | |
| 2006/0079010 A1 | 4/2006 | Hara et al. | |
| 2006/0145177 A1 | 7/2006 | Hagimoto et al. | |
| 2007/0032089 A1 | 2/2007 | Nuzzo et al. | |
| 2007/0173034 A1 | 7/2007 | Tsurume et al. | |
| 2007/0281556 A1 | 12/2007 | Elliott et al. | |
| 2008/0108171 A1 | 5/2008 | Rogers et al. | |
| 2010/0139368 A1 * | 6/2010 | Kotovsky | G01N 21/1702 73/24.06 |
| 2010/0248484 A1 | 9/2010 | Bower et al. | |
| 2010/0306993 A1 | 12/2010 | Mayyas et al. | |
| 2010/0317132 A1 | 12/2010 | Rogers et al. | |
| 2010/0326518 A1 | 12/2010 | Juso et al. | |
| 2012/0228669 A1 | 9/2012 | Bower et al. | |
| 2012/0314388 A1 | 12/2012 | Bower et al. | |
| 2013/0069275 A1 | 3/2013 | Menard et al. | |
| 2013/0088416 A1 | 4/2013 | Smith et al. | |
| 2013/0196474 A1 | 8/2013 | Meitl et al. | |
| 2013/0207964 A1 | 8/2013 | Fleck et al. | |
| 2013/0221355 A1 | 8/2013 | Bower et al. | |
| 2013/0273695 A1 | 10/2013 | Menard et al. | |
| 2014/0104243 A1 | 4/2014 | Sakariya et al. | |
| 2014/0264763 A1 | 9/2014 | Meitl et al. | |
| 2014/0267683 A1 | 9/2014 | Bibl et al. | |
| 2014/0340900 A1 | 11/2014 | Bathurst et al. | |
| 2014/0367633 A1 | 12/2014 | Bibl et al. | |
| 2015/0028362 A1 | 1/2015 | Chan et al. | |
| 2015/0135525 A1 | 5/2015 | Bower | |
| 2015/0137153 A1 | 5/2015 | Bibl et al. | |
| 2015/0137187 A1 | 5/2015 | Aoki et al. | |
| 2015/0371874 A1 | 12/2015 | Bower et al. | |
| 2015/0372053 A1 | 12/2015 | Bower et al. | |
| 2016/0020131 A1 | 1/2016 | Bower et al. | |
| 2016/0086855 A1 | 3/2016 | Bower et al. | |
| 2016/0093600 A1 | 3/2016 | Bower et al. | |
| 2017/0047306 A1 | 2/2017 | Meitl et al. | |
| 2017/0154819 A1 | 6/2017 | Bower et al. | |
| 2017/0173852 A1 | 6/2017 | Moore et al. | |
| 2017/0256521 A1 | 9/2017 | Cok et al. | |
| 2018/0096964 A1 | 4/2018 | Bonafede et al. | |
| 2019/0051552 A1 | 2/2019 | Bower et al. | |

FOREIGN PATENT DOCUMENTS

| | | |
|---|---|---|
| JP | 2006108441 A | 4/2006 |
| JP | 2009105450 A | 5/2009 |
| JP | 2011066130 A | 3/2011 |
| WO | WO-2008/036837 A2 | 3/2008 |
| WO | WO-2008/103931 A2 | 8/2008 |
| WO | WO-2011/123285 A1 | 10/2011 |
| WO | WO-2015/193435 A1 | 12/2015 |

OTHER PUBLICATIONS

Cok, R. S. et al., Inorganic light-emitting diode displays using micro-transfer printing, Journal of the SID, 25(10):589-609, (2017).

Delmdahl, R. et al., Large-area laser-lift-off processing in microelectronics, Physics Procedia 41:241-248 (2013).

* cited by examiner

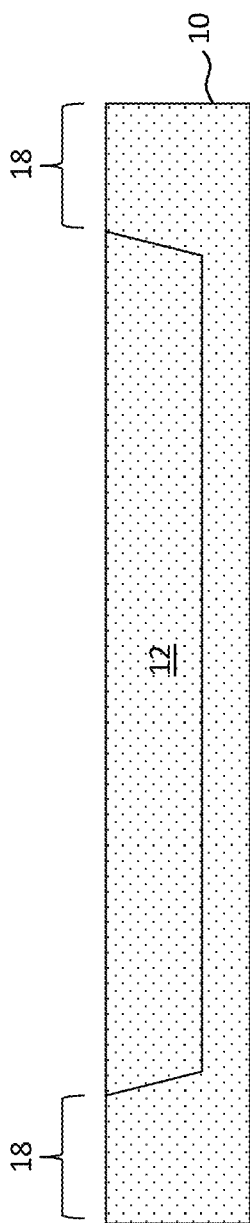
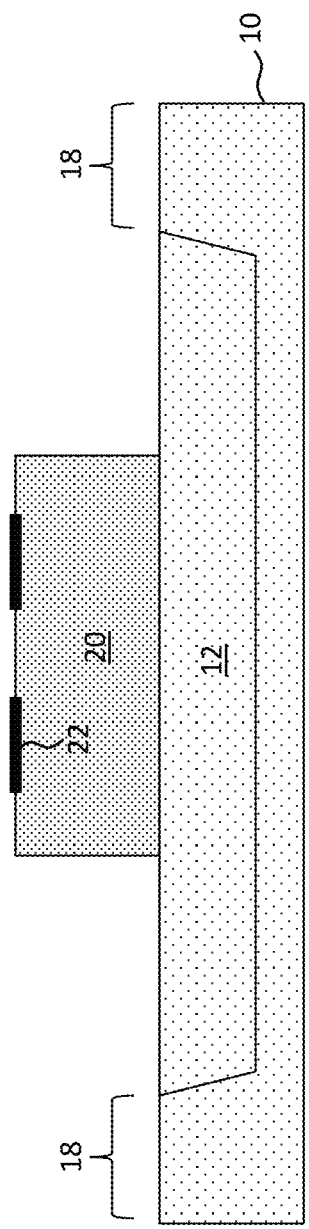

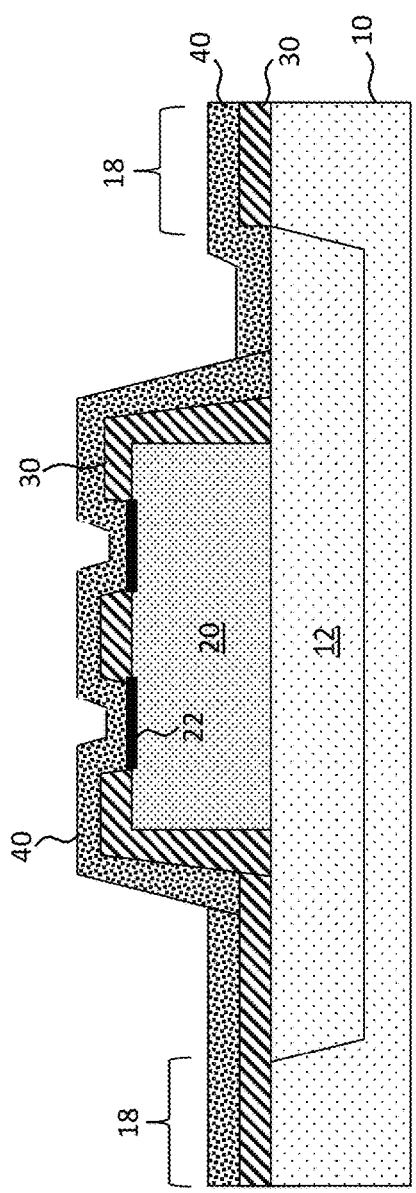
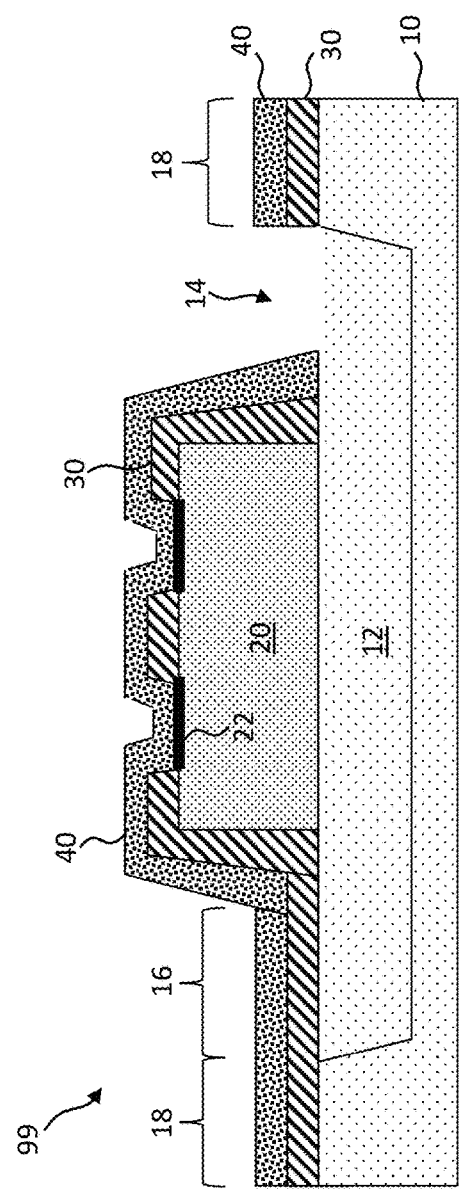
FIG. 3E
FIG. 3F

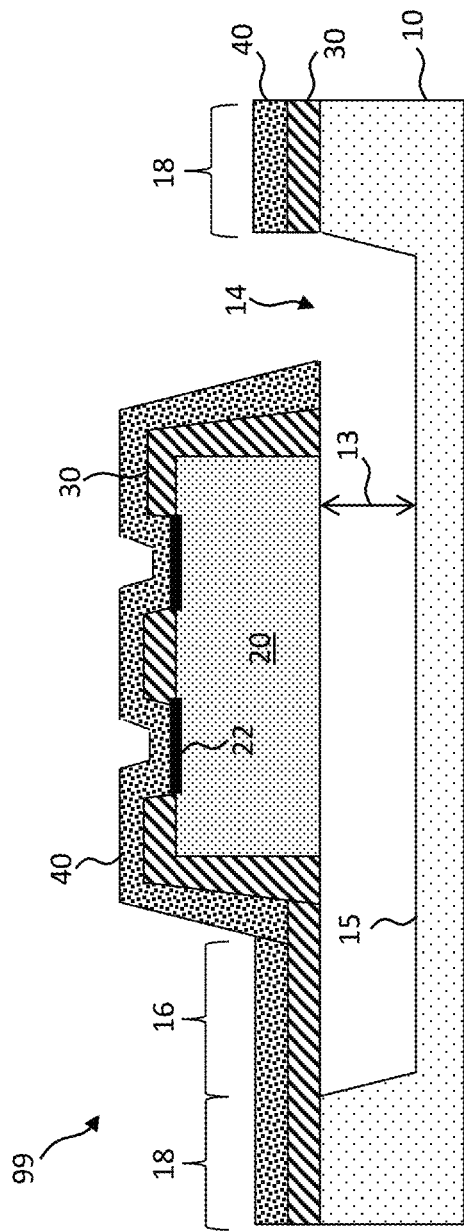
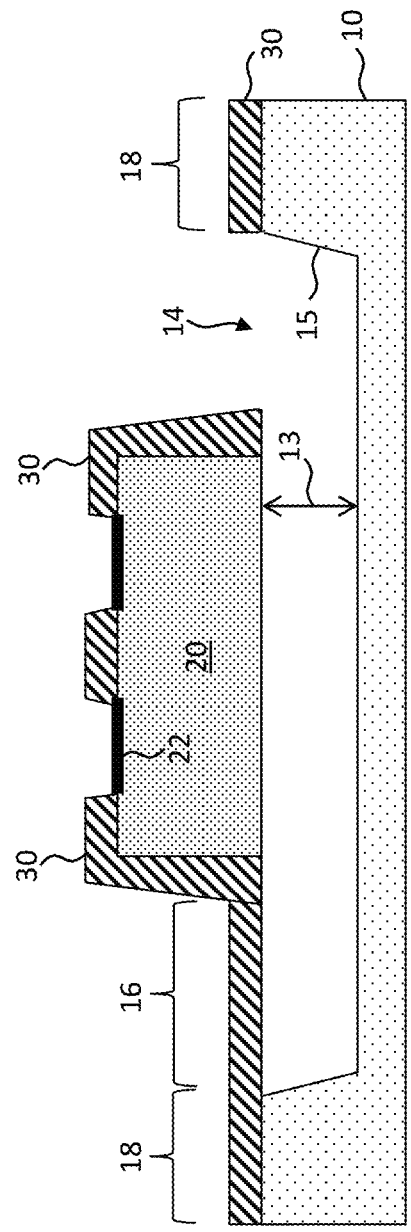
FIG. 3G
FIG. 3H

MULTI-LAYER TETHERS FOR MICRO-TRANSFER PRINTING

TECHNICAL FIELD

The present disclosure relates generally to micro-transfer printing micro-devices from source wafers and, in particular, to tethers physically connecting micro-devices to source wafers.

BACKGROUND

Substrates with components such as electronically active devices or other structures distributed over the extent of the substrate can be used in a variety of electronic systems, for example, flat-panel imaging devices such as flat-panel liquid crystal or organic light emitting diode (OLED) display devices and in flat-panel solar cells. A variety of methods may be used to distribute components over a substrate, including forming the components on the substrate, for example forming thin-film transistors made using photolithographic methods and materials on the substrate, and forming the components on separate wafers using integrated circuit techniques and transferring the components to a substrate, for example using pick-and-place tools or micro-transfer printing.

One exemplary micro-transfer printing method for transferring active components from one substrate to another is described in *AMOLED Displays using Transfer-Printed Integrated Circuits* published in the Proceedings of the 2009 Society for Information Display International Symposium Jun. 2-5, 2009, in San Antonio Tex., US, vol. 40, Book 2, ISSN 0009-0966X, paper 63.2 p. 947 and in *Inorganic light-emitting diode displays using micro-transfer printing* published in the Journal of the Society for Information Display 25/10, 2017, 1071-0922/17/2510-06, DOI #10.1002/jsid.610, p. 589. In this approach, small integrated circuits are formed over a patterned sacrificial layer on the process side of a crystalline wafer. The small integrated circuits, or chiplets, are released from the wafer by etching the patterned sacrificial layer beneath the circuits. A PDMS stamp is pressed against the wafer and the process side of the chiplets is adhered to the stamp. The chiplets are removed from the wafer by the stamp and are pressed against a destination substrate or backplane coated with an adhesive and thereby adhered to the destination substrate. The adhesive is subsequently cured. In another example, U.S. Pat. No. 8,722,458 entitled Optical Systems Fabricated by Printing-Based Assembly teaches transferring light-emitting, light-sensing, or light-collecting semiconductor elements from a wafer substrate to a destination substrate or backplane.

After the patterned sacrificial layer is etched and before the chiplets are transferred, the chiplets are attached by tethers to anchors in the wafer so that their physical, spatial relationship to the wafer is maintained and the chiplets can be printed accurately and precisely. It is important that the tether maintain the position of the chiplet with respect to the wafer and allow the stamp to fracture or separate the chiplet from the anchor during the micro-transfer printing process. If the tether is too fragile, the chiplets can detach entirely from the wafer prior to printing and if the tether is too robust, the stamp cannot detach the chiplets from the wafer. In either case, the result is that the chiplet is not properly transferred from the source wafer to the destination substrate.

There is a need, therefore, for tether structures and micro-transfer printing methods that efficiently, accurately, and precisely enable the transfer of a wide variety of micro-devices from a source wafer to a destination substrate with high yields.

SUMMARY

In one aspect, the present invention is directed to a micro-device structure comprises a source substrate comprising sacrificial portions laterally spaced apart by anchors. At least a portion (e.g., part or segment) of each sacrificial portion is exposed through an opening. The micro-device is disposed exclusively in direct contact with each sacrificial portion and is laterally attached to an anchor by a multi-layer tether.

In some embodiments of the present invention, a multi-layer tether is a bilayer tether consisting essentially of two tether layers. In some embodiments of the present invention, a multi-layer tether has more than two tether layers, for example three, four, or more tether layers. A multi-layer tether can comprise a first tether layer adjacent to a source substrate and a second tether layer on a side of the first tether layer opposite the source substrate. The first tether layer can extend over at least a portion of a micro-device, the second tether layer can extend over at least a portion of the micro-device, or the first tether layer can extend over at least a first portion of the micro-device and the second tether layer can extend over at least a second portion of the micro-device. The first and second portions can be the same portion of the micro-device or different portions.

In some embodiments, a multi-layer tether comprises an oxide, a nitride, or both an oxide and a nitride. In some embodiments, the multi-layer tether comprises a first tether layer comprising silicon dioxide and a second tether layer comprising silicon nitride. In some embodiments, the first tether layer of silicon dioxide is disposed between the second tether layer of silicon nitride and the sacrificial portion. In some embodiments, the first tether layer, the second tether layer, or both the first tether layer and the second tether layer encapsulate the micro-device. In some embodiments, a first tether layer is thicker than a second tether layer. In some embodiments, the first tether layer is 1.5 to 3 times as thick as the second tether layer, for example twice as thick.

In certain embodiments of the present invention, each micro-device comprises one or more contact pads and a first tether layer encapsulates each micro-device except for one or more contact pads and a second tether layer encapsulates each micro-device including the one or more contact pads.

In some embodiments, sacrificial portions comprise a sacrificial material that is a same material as a material of a source substrate, and the same sacrificial material is an anisotropically etchable material. In some embodiments, sacrificial portions comprise a sacrificial material that is a different material from a material of the source substrate, and the sacrificial material is differentially etchable from the material of the source substrate.

In some embodiments of the present invention, micro-devices have a thickness greater than or equal to 5 µm, 10 µm, 15 µm, 20 µm, or 50 µm. In some embodiments of the present invention, the micro-devices have a thickness in the range of 16-17 µm. In some embodiments of the present invention, micro-devices have one or more of a length greater than or equal to 250 µm, 500 µm, or 1000 µm and a width greater than or equal to 250 µm, 500 µm, or 1000 µm. In some embodiments of the present invention, micro-devices have at least one of a length and a width that is two to four times a length of the multi-layer tether, where a length of the micro-devices and tethers is longer than the width and is taken in a direction substantially parallel to an extent or surface of the source substrate.

In some embodiments of the present invention, micro-devices are laterally attached to the one of the anchors only by a single multi-layer tether. In some embodiments, the micro-devices are laterally attached to a second one of the anchors by a second tether. The second tether can be disposed on an opposite side of the micro-device from the first multi-layer tether. The second tether can be a multi-layer tether.

In another aspect, the present invention is directed to a method of making a micro-device structure comprising: providing a source substrate comprising sacrificial portions spaced apart by anchors, disposing micro-devices in association with the source substrate such that each micro-device is disposed exclusively on, in, or over a sacrificial portion, depositing a first tether layer over at least a portion of the source substrate and the micro-devices, depositing a second tether layer over the first tether layer, and patterning the first tether layer and the second tether layer to form (i) a multi-layer tether for each micro-device such that the multi-layer tether laterally attaches the micro-device to an anchor, and (ii) an opening exposing each sacrificial portion. In some methods, the first tether layer and the second tether layer are each patterned to expose contact pads provided in each micro-device in separate steps.

In some embodiments of the present invention, the method comprises etching sacrificial portions to release micro-devices from a source substrate. In some embodiments, each micro-device comprises one or more contact pads, deposition of the first tether layer is an unpatterned blanket deposition, and the method comprises removing the first tether layer at least from the one or more contact pads of each micro-device before depositing the second tether layer over the first layer.

In some embodiments, the second tether layer deposition is an unpatterned blanket deposition. Some embodiments of the present invention comprise removing the second tether layer after patterning the first tether layer and the second tether layer, for example after etching the sacrificial portions and before micro-transfer printing the micro-devices.

In some embodiments of the present invention, the method comprises contacting micro-devices on a source substrate with a stamp to adhere the micro-devices to the stamp, removing the stamp and the micro-devices from the source substrate, adhering the micro-devices to a destination substrate, and removing the stamp from the destination substrate, to micro-transfer print the micro-devices from the source substrate to the destination substrate.

In another aspect, the present invention is directed to a micro-device structure comprises: a source substrate comprising anchors that are spaced apart and recessed portions between the anchors; and a micro-device disposed exclusively over each of the recessed portions and laterally attached to one of the anchors by a multi-layer tether, thereby defining a gap between the micro-device and the source substrate, wherein the gap is exposed through an opening.

In some embodiments, the multi-layer tether comprises a first tether layer comprising silicon dioxide and a second tether layer comprising silicon nitride.

In some embodiments, the multi-layer tether comprises a first tether layer adjacent to the source substrate and a second tether layer on a side of the first tether layer opposite the source substrate, wherein the first tether layer extends over at least a portion of the micro-device, wherein the second tether layer extends over at least a portion of the micro-device, or wherein the first tether layer extends over at least a first portion of the micro-device and the second tether layer extends over at least a second portion of the micro-device. In some embodiments, the micro-device comprises one or more contact pads and the first tether layer encapsulates the micro-device except for the one or more contact pads and the second tether layer encapsulates the micro-device including the one or more contact pads.

In some embodiments, the micro-device has at least one of a length greater than or equal to 250 µm, 500 µm, or 1000 µm, a width greater than or equal to 250 µm, 500 µm, or 1000 µm, and a thickness greater than or equal to 5 µm, 10 µm, 15 µm, 20 µm, or 50 µm.

Certain embodiments of the present invention provide tether structures and micro-transfer printing methods that efficiently, accurately, and precisely enable the transfer of a wide variety of micro-devices from a source wafer to a destination substrate with high yields.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 3A-3I are successive cross sections illustrating an exemplary method and micro-device structures, according to illustrative embodiments of the present invention;

Figure 1:
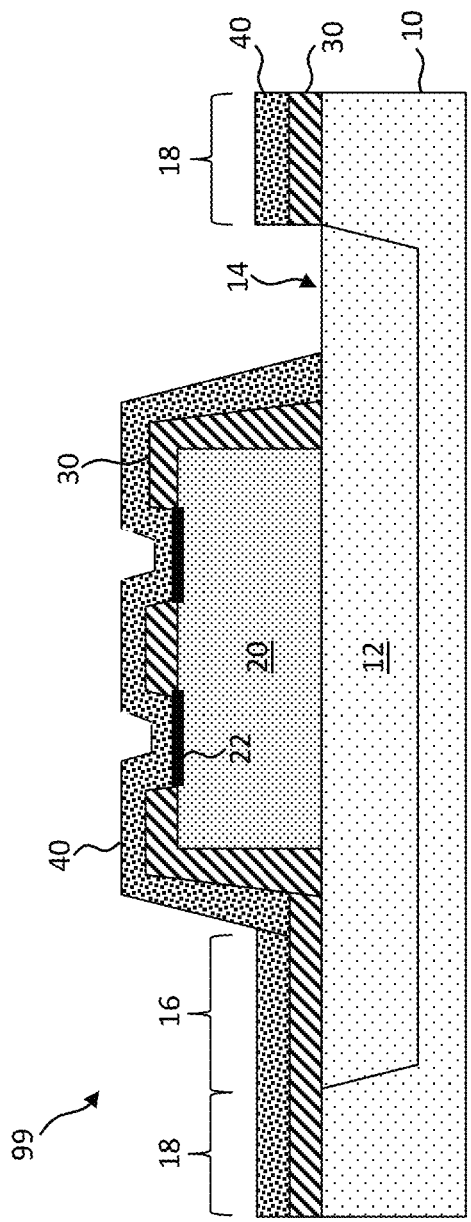
FIG. 1 is a schematic cross section illustrating an exemplary micro-device structure, according to illustrative embodiments of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION

Certain embodiments of the present invention provide tether structures and micro-transfer printing methods that efficiently, accurately, and precisely enable the transfer of a wide variety of micro-devices from a source wafer to a destination substrate with high yields. In particular, certain embodiments of the present invention provide tether structures useful for micro-transfer printing relatively large micro-devices, for example devices having a width or length, or both, equal to or greater than 250 µm, 400 µm, 500 µm, 600 µm, 800 µm, 1 mm, 2 mm, or 5 mm. In some embodiments, micro-devices have a thickness greater than or equal to 5 µm, 10 µm, 15 µm, 20 µm, or 50 µm. In some embodiments, micro-devices have a thickness that is in the range of about 16-17 µm.

According to certain embodiments of the present invention and as illustrated in FIG. 1, a micro-device structure 99 comprises a source substrate 10 comprising sacrificial portions 12 laterally spaced apart by anchors 18. A portion (e.g., part or segment) of each sacrificial portion 12 is exposed through an opening 14 so that process gases or liquids can be introduced through the opening 14 to the sacrificial portions 12 to process the sacrificial portions 12, for example to etch the sacrificial portions 12. A micro-device 20 is disposed exclusively in direct contact with each sacrificial portion 12 and is laterally attached to an anchor 18 by a multi-layer tether 16. A micro-device 20 disposed exclusively in direct contact with each sacrificial portion 12 is in contact only with a sacrificial portion 12 and not with any other portion of the source substrate 12 or structure except for one or more tethers 16 (e.g., including at least one multi-layer tether 16). Sacrificial portions 12 can be a solid material. In certain embodiments, a sacrificial portion 12 has been etched such that the volume that was occupied by the sacrificial portion defines a gap separating micro-devices 20 from a source substrate 10 such that micro-devices 20 are disposed exclusively over recessed portions 15 of the source substrate 10 between anchors 18.

A source wafer 10 can also be a source substrate 10 and can be any of a wide variety of relatively flat, stable materials suitable for photolithographic or integrated circuit processing, for example glass, plastic, a crystalline semiconductor such as silicon, a compound semiconductor that comprises materials such as gallium nitride or gallium arsenide, quartz, or sapphire, or any suitable substrate or wafer material.

In some embodiments, sacrificial portions 12 are anisotropically etchable designated portions of a source wafer 10, for example portions of a crystalline semiconductor material on a process side of the source wafer 10. In such embodiments, sacrificial portions 12 comprise a sacrificial material that is a same material as a source substrate material. In some embodiments, a source wafer 10 comprises a multi-layer structure including a layer of material on a process side of the source wafer 10 that is differentially etchable from a remainder of the source substrate 10. In some such embodiments, sacrificial portions 12 can comprise a sacrificial material that is a different material from another material of a source substrate 10. The differentially etchable layer can be a patterned layer defining sacrificial portions 12 and can comprise a material that is differentially etchable from other layers of a source wafer 10 and from a micro-device 20. For example, a source wafer 10 can be a semiconductor, glass, quartz, or sapphire source wafer 10 and sacrificial portions 12 can comprise an oxide such as silicon dioxide or a nitride.

Sacrificial portions 12 are laterally distributed over a process side of a source wafer 10 and are separated by anchors 18. Anchors 18 can simply be portions of the source wafer 10 that are not etched or otherwise removed from the source wafer 10 during processing. The processing can be photolithographic or integrated circuit processing using, for example, methods and materials known in the art. A sacrificial portion 12 can be etched, thereby defining a gap 13 between a micro-device 20 and a source substrate 10, particularly after the sacrificial portion 12 is etched to remove material from the sacrificial portion 12. After etching, micro-devices 20 are disposed exclusively over recessed portions 15 of the source substrate 10 (e.g., between anchors 18).

Micro-devices 20 can be any useful structure intended for micro-transfer printing and comprise any material or structure useful for the intended purpose of the micro-devices 20. Micro-devices 20 can be electronic, mechanical, or optical structures, can be passive or active, or can be integrated circuits, electronic devices, or opto-electronic devices. It is contemplated that there is no inherent limit to the type, function, or materials of micro-devices 20. Micro-devices 20 can comprise a same material as a material of a source substrate 10.

Each micro-device 20 is disposed exclusively in direct contact with a sacrificial portion 12 of a source substrate 10 so that, when the sacrificial portion 12 is etched, the volume that was occupied by the sacrificial portion 12 defines a gap 13 between the micro-device 20 and the source substrate 10 and the micro-device 20 is suspended over the gap 13 by one or more tethers 16 (e.g., as shown in FIGS. 3G and 3H). Thus, a material of the sacrificial portion 12 is differentially or anisotropically etchable not only with respect to the remaining portion of the source wafer 10 and anchors 18 but is also differentially or anisotropically etchable with respect to any or all of the micro-device 20, a substrate of a micro-device 20, and an encapsulating layer of a micro-device 20. Thus, micro-devices 20 can comprise a support layer or substrate, for example comprising a material relatively inert with respect to etchants of sacrificial portions 12, on which an active material is disposed for example a semiconductor or other structure. Micro-devices 20 can comprise semiconductor materials such as silicon or gallium or indium or compound semiconductor materials including such elements or other elements (e.g., III-V, II-VI, or both III-V and II-VI semiconductor compounds) and can comprise structures such as electrically conductive contact pads 22 for making electrical contact to the micro-devices 20, doped semiconductor portions, wires, resistors, capacitors, or electrical or optical structures, or any combination of these, and any materials useful in such structures.

Tethers 16 are structures physically connecting each micro-device 20 to an anchor 18. In the present disclosure, a tether 16 can refer to a multi-layer tether 16, a bi-layer tether 16, or a tether 16 comprising a single layer. Each micro-device 20 can be physically connected, for example laterally attached, by one or more, for example two, multi-layer tethers 16 to anchors 18. Multi-layer tethers 16 can comprise materials that are part of an anchor 18, part of a micro-device 20, or can be other materials, including materials that permanently or temporarily encapsulate a micro-device 20. In some embodiments of the present invention, micro-devices 20 are laterally attached to anchors 18 and a source substrate 10 only by a multi-layer tether 16 after the semiconductor portions are etched to define a gap 13 (e.g., such that etching defines the multi-layer tether 16). In some embodiments of the present invention, a desired ratio of a length of a multi-layer tether 16 along a side of a micro-device 20 can depend on a size of the micro-device 20. Thus, according to some embodiments of the present invention, a micro-device 20 has at least one of a length and a width that is two to four times (or more) a length of a multi-layer tether 16 that is attached to the micro-device 20. In some embodiments, a micro-device 20 has a length that is substantially three times a length of the multi-layer tether 16, where a length of a multi-layer tether 16 and a micro-device 20 is taken in a direction L orthogonal to the direction W of an anchor 18 from a micro-device 20 (as shown in FIGS. 4-7 and discussed below).

A multi-layer tether 16 comprises a plurality of layers. According to some embodiments of the present invention, a multi-layer tether 16 is a bi-layer tether 16 comprising only two layers. In some embodiments of the present invention, a multi-layer tether 16 consists essentially of only two layers, for example a first tether layer 30 adjacent to a source wafer 10 and a second tether layer 40 on a side of the first tether layer 30 opposite to the source wafer 10, as shown in FIG. 1. A first tether layer 30 and a second tether layer 40 can have the same or substantially similar thickness. In some embodiments, a first tether layer 30 and a second tether layer 40 have different thicknesses, for example the first tether layer 30 can be 1.5 to 3 times thicker than the second tether layer 40. In some embodiments, a first tether layer 30 is substantially two times thicker than a second tether layer 40. In some embodiments, a multi-layer tether 16 comprises more than two layers. For example, a multi-layer tether 16 can consist essentially of only three layers or consist essentially of only four layers.

In some embodiments of the present invention, a multi-layer tether 16 comprises an oxide, a nitride, or both an oxide and a nitride. The multi-layer tether 16 can comprise a first tether layer 30 comprising silicon dioxide and a second tether layer 40 comprising silicon nitride. The silicon dioxide first tether layer 30 can be adjacent to a source wafer 10 or sacrificial portion 12 and the silicon nitride second tether layer 40 can be on a side of the silicon dioxide first tether layer 30 opposite the source wafer 10 or sacrificial portion 12. In such a case, the first tether layer 30 of silicon dioxide is disposed between the second tether layer 40 of silicon nitride and the sacrificial portion 12 or sacrificial portion 12.

In some embodiments of the present invention, a first tether layer 30 extends over at least a portion of a micro-device 20, a second tether layer 40 extends over at least a portion of a micro-device 20, or a first tether layer 30 extends over at least a first portion of a micro-device 20 and a second tether layer 40 extends over at least a second portion of the micro-device 20. The first and second portions can be the same portion or different portions. In some embodiments, a first tether layer 30, a second tether layer 40, or both the first tether layer 30 and the second tether layer 40 encapsulate a micro-device 20. An encapsulation layer can protect a micro-device 20 (e.g., the process side thereof, other portion thereof, or the entirety thereof) from the environment, for example from photolithographic processing gases or liquids or from environmental gases such as air, oxygen, nitrogen, and ozone, environmental liquids such as water, or particulate contamination such as dust or other airborne particles.

In some embodiments in which micro-devices 20 each comprise one or more contact pads 22, a first tether layer 30 can encapsulate the micro-devices 20 except for the one or more contact pads 22 and a second tether layer 40 can encapsulate the micro-device 20 including the one or more contact pads 22.

Figure 2:
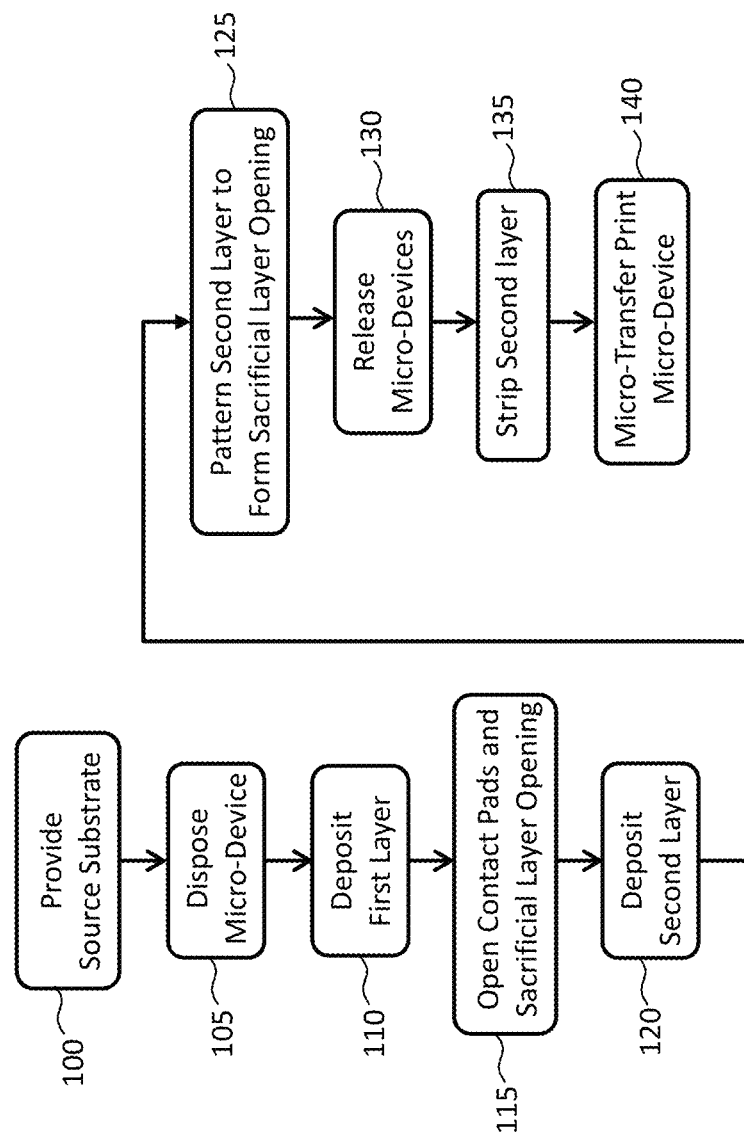
FIG. 2 is a flow diagram of exemplary methods, according to illustrative embodiments of the present invention.
Figure 3C:
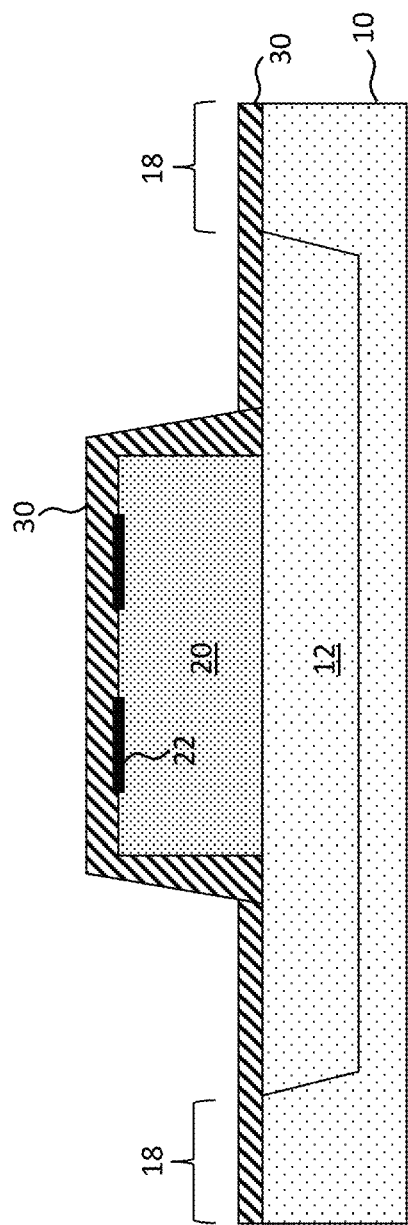

Referring to the FIG. 2 flow diagram and the corresponding successive cross sections of FIGS. 3A-3I, a method of making a micro-device structure 99 comprises providing a source substrate 10 comprising sacrificial portions 12 laterally spaced apart by anchors 18 in step 100 and as shown in FIG. 3A. As shown in FIG. 3B, in step 105 a micro-device 20 is disposed in association with the source substrate 10 on, in or over each sacrificial portion 12. Each micro-device 20 can be located entirely and exclusively over a sacrificial portion 12 so that each micro-device 20 is disposed exclusively on, in, or over one of the sacrificial portions 12 and none of the micro-devices 20 are disposed over or in contact with the anchors 18 or other portions of the source substrate 10. Micro-devices 20 can comprise a contact pad 22 for making electrical contact to each micro-device 20 to operate the micro-device 20. Micro-devices 20 can be formed using photolithographic methods and materials found in semiconductor fabrication facilities such as integrated circuit foundries and can be, for example, electronic or opto-electronic integrated circuits.

Figure 3D:
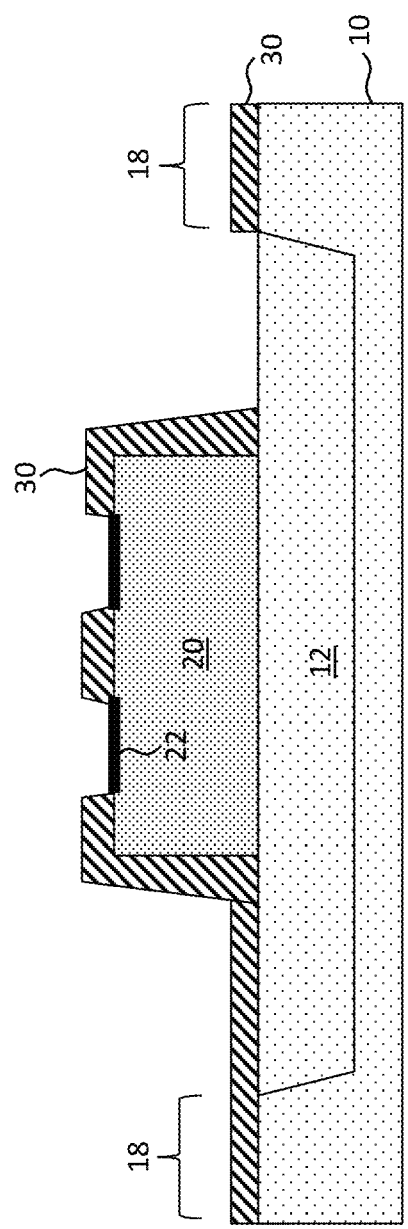

As shown in FIG. 3C, in step 110 a first tether layer 30 is disposed over at least a portion of anchors 18 and micro-devices 20 and a source substrate 10 using a first deposition method. Referring to FIG. 3C, where sacrificial portions 12 are exposed (not covered by a micro-device 20), the first tether layer 30 covers the exposed parts of the sacrificial portions 12. Deposition of a first tether layer 30 can be a blanket (unpatterned) deposition, for example a first deposition method such as continuous, single-frequency plasma-enhanced chemical vapor deposition (PECVD). As shown in FIG. 3D, in step 115 the first tether layer 30 is patterned, for example by using photolithographic processes, masks, and etchants to remove portions of the first tether layer 30, to expose the contact pads 22 and an opening 14 to the sacrificial portion 12, and to form a tether 16 so that the tether 16 is the only portion of the first tether layer 30 that physically connects the micro-devices 20 to an anchor 18.

In step 120, and as shown in FIG. 3E, a second tether layer 40 is deposited over a first tether layer 30 using a second deposition method, for example a second deposition method such as a pulsed, multi-frequency plasma-enhanced chemical vapor deposition (PECVD). Deposition of the second tether layer 40 can be a blanket (unpatterned) deposition and can employ a second deposition method that has at least some different attributes from the first deposition method of the first tether layer 30, thus forming a multi-layer tether 16 for each micro-device 20 such that the multi-layer tether 16 laterally attaches each micro-device 20 to an anchor 18.

Generally, a second deposition can be, but does not need to be, made using a second deposition method. According to some embodiments of the present invention, deposition of a first tether layer 30 and deposition of a second tether layer 40 are done using at least partially different deposition methods or the second deposition method deposits a different material that has a different deposited structure from the first deposition method. For example, a first tether layer 30 can be deposited using PECVD with a continuous plasma generation method having one frequency to deposit silicon dioxide and a second tether layer 40 can be deposited using PECVD using a pulsed plasma generation method with two different frequencies to deposit silicon nitride. Two different deposition methods of two different materials can form first and second tether layers 30, 40 with different attributes and structures. In step 125 and as shown in FIG. 3F, the second tether layer 40 is patterned to form an opening 14 exposing each sacrificial portion 12. One or more depositions can be used to form a second tether 16 that connects a micro-device to the same or a different anchor 18 as a multi-layer tether 16. The one or more depositions can, but do not necessarily, include one or more depositions used to make the multi-layer tether 16.

In step 130, and as shown in FIG. 3G, sacrificial portions 12 are etched to release micro-devices 20 from a source substrate 10, so that micro-devices 20 are suspended over gaps 13 (and thus over recessed portions 15 of the source substrate 10) separating micro-devices 20 from the source substrate 10 and are attached to anchors 18 and the source wafer 10 with multi-layer tethers 16 (e.g., with only multi-layer tethers 16), for example by introducing an etchant into an opening 14. The etchant selectively etches each sacrificial portion 12 while leaving micro-devices 20 and the remainder of the source substrate 10 substantially undisturbed. In some embodiments, after etching sacrificial portions 12, a micro-device 20 is physically connected to one or more anchors 18 with one or more tethers 16 and suspended over a recessed portion 15 of a source wafer 10, wherein at least one of the one or more tethers 16 is a multi-layer tether 16 (e.g., all are multi-layer tethers 16) and each of the one or more tethers 16 connects the micro-device 20 to only one of the one or more anchors 18.

Figure 3I:
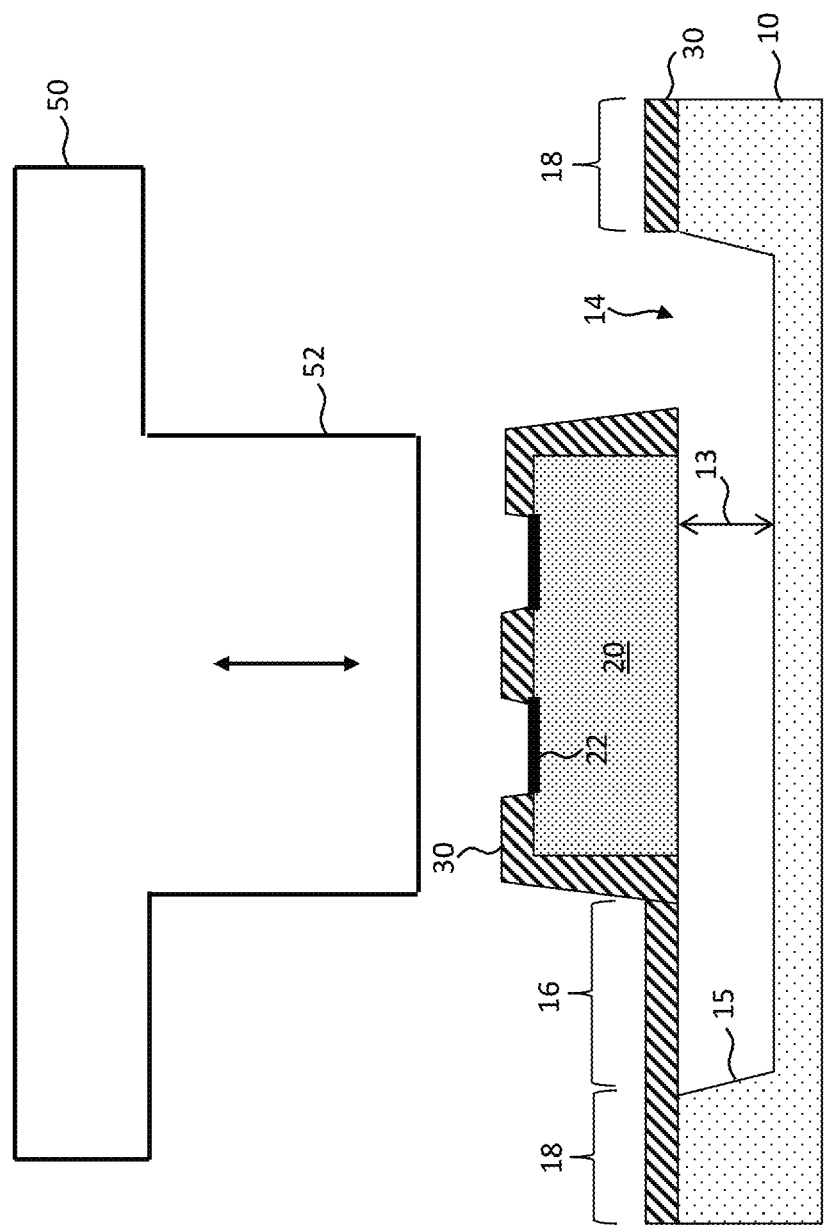
Figure 4:
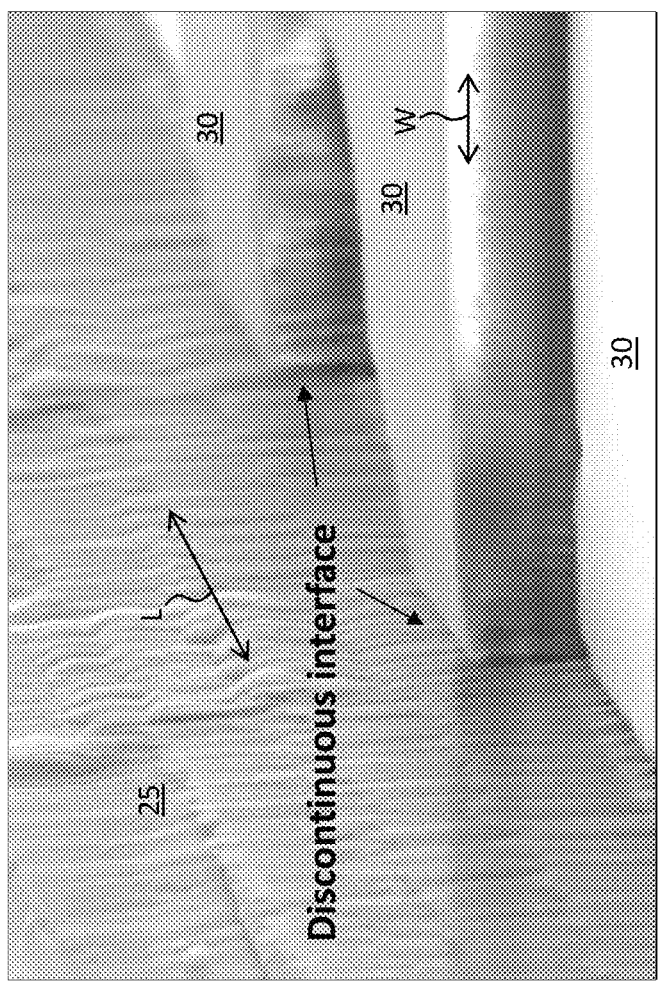
FIG. 4 is a perspective micrograph illustrating an anchor and a detached tether useful in understanding certain embodiments of the present invention.

In step 135, and as shown in FIG. 3H, a second tether layer 40 can be removed by an unpatterned blanket etch, exposing contact pads 22. Such a process can essentially reduce the number of layers in a tether 16 (e.g., such that a bilayer tether 16 becomes a single layer tether 16). In this way, a layer (e.g., second tether layer 40) can serve to stabilize a tether 16 during an etching process (e.g., etching of sacrificial portions 12) before being removed by a separate etching process. Micro-devices 20 are then physically connected to a source wafer 10 with a tether 16 that physically holds micro-devices 20 in place with respect to the source wafer 10 so that micro-devices 20 can be micro-transfer printed in step 140 from the source wafer 10. For example, micro-devices 20 can be micro-transfer printed in step 140 by contacting each of the micro-devices 20 with a respective stamp post 52 of a transfer stamp 50 to adhere the micro-devices 20 to the stamp posts 52, and then removing the transfer stamp 50 from the source wafer 10, thereby fracturing or separating the tethers 16 (FIG. 3I). The stamp 50 is then relocated to a destination substrate, micro-devices 20 are pressed against the destination substrate to adhere micro-devices 20 to the destination substrate, and the stamp 50 is removed from micro-devices 20 and the destination substrate. The destination substrate can comprise an adhesive layer to assist in adhering micro-devices 20 to the destination substrate. After micro-devices 20 are adhered to the adhesive layer, the adhesive layer can be cured to permanently affix micro-devices 20 to the destination substrate.

Micro-transfer printing micro-devices 20 comprising different materials from different source wafers 10 to a common destination substrate with one or more stamps 50 enables the construction of heterogeneous micro-systems useful in applications for which a small size and a variety of device structures and materials are desirable. The use of a multi-layer tether 16 enables micro-transfer printing with a wider variety of micro-devices 20 sizes, types, and materials, (in particular, larger micro-devices 20) thereby realizing a wider variety of micro-systems.

Figure 5:
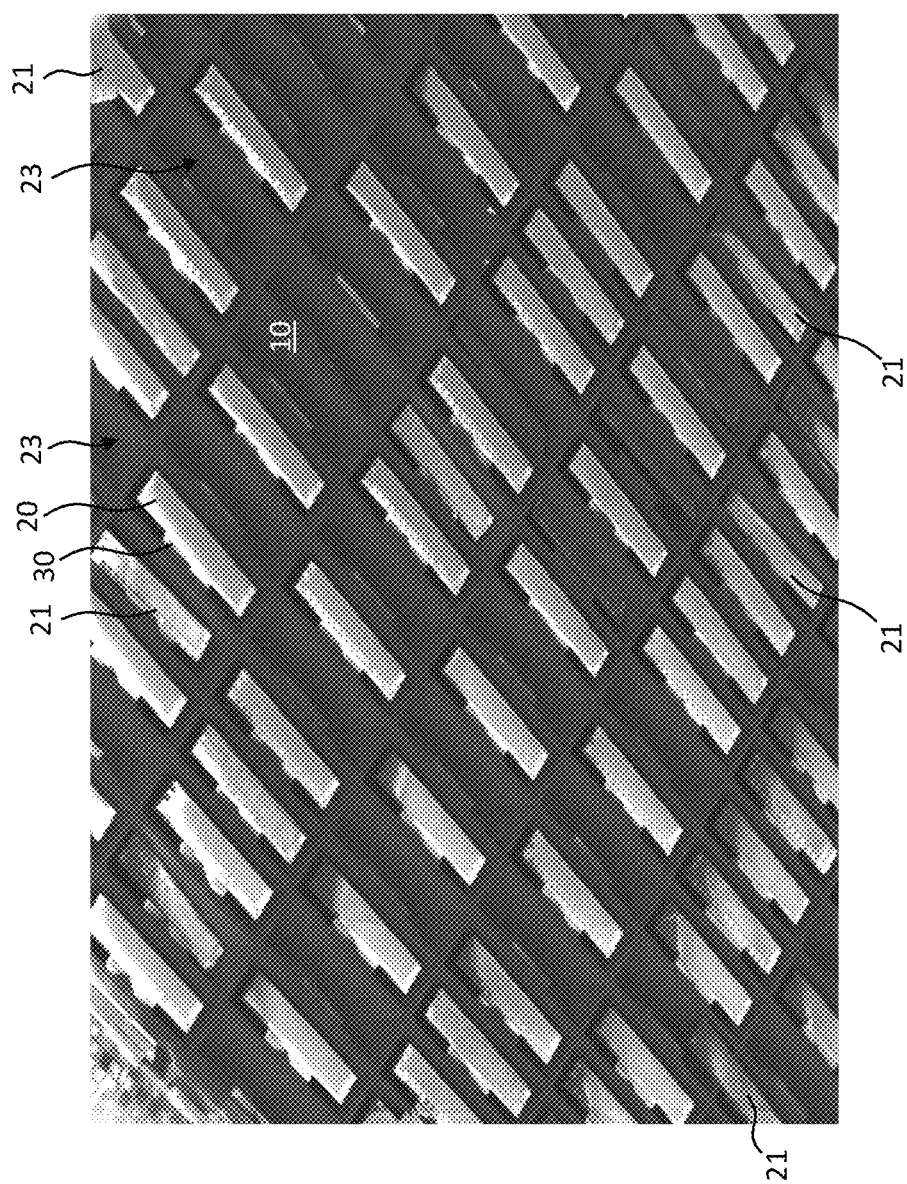
FIG. 5 is a perspective micrograph illustrating a source wafer having missing micro-devices useful in understanding certain embodiments of the present invention.

Certain embodiments of the present invention provide advantages in forming micro-transfer printable micro-devices 20 that are relatively thicker (for example greater than or equal to 10 µm thick, greater than or equal to 15 µm thick, or greater than or equal to 20 µm thick, for example about 16-17 µm thick) than other micro-devices 20 (for example less than or equal to 10 µm thick). Because of the increased thickness of the micro-devices 20, the deposition of selectively etchable materials, such as silicon dioxide, useful in constructing tethers 16 can be problematic. The greater thickness of micro-devices 20 form taller micro-device sidewalls 25 that can obscure portions of the source substrate 10, especially between micro-devices 20 and anchors 18, inhibiting a conformal and consistent deposition of a first tether layer 30, thus preventing a continuous tether-to-device interface structure. Referring to the micrograph of FIG. 4 for silicon semiconductor micro-devices 20 having a length of 1000 µm, a width of 200 µm, and a thickness of 17 µm, the interface between the anchors 18 and the first tether layer 30 is discontinuous and the first tether layer 30 is not well adhered to the micro-device sidewall 25. This discontinuity can result in micro-devices 20 detaching from the source substrate 10 so that the micro-devices 20 cannot be reliably and accurately micro-transfer printed, as shown in FIG. 5. FIG. 5 is a micro-graph of an array of micro-devices 20 disposed on a source wafer 10 with a single layer tether 16 (comprising only a first tether layer 30). The absent micro-device locations 23 in the array are locations in which the micro-devices 20 became detached or dislodged and floated away from the source wafer 10 and are absent or removed and not available in place for micro-transfer printing; mis-located micro-devices 21 are mis-located with respect to the source wafer 10, inhibiting accurate and precise transfer despite remaining present on the source wafer 10.

Figure 6:
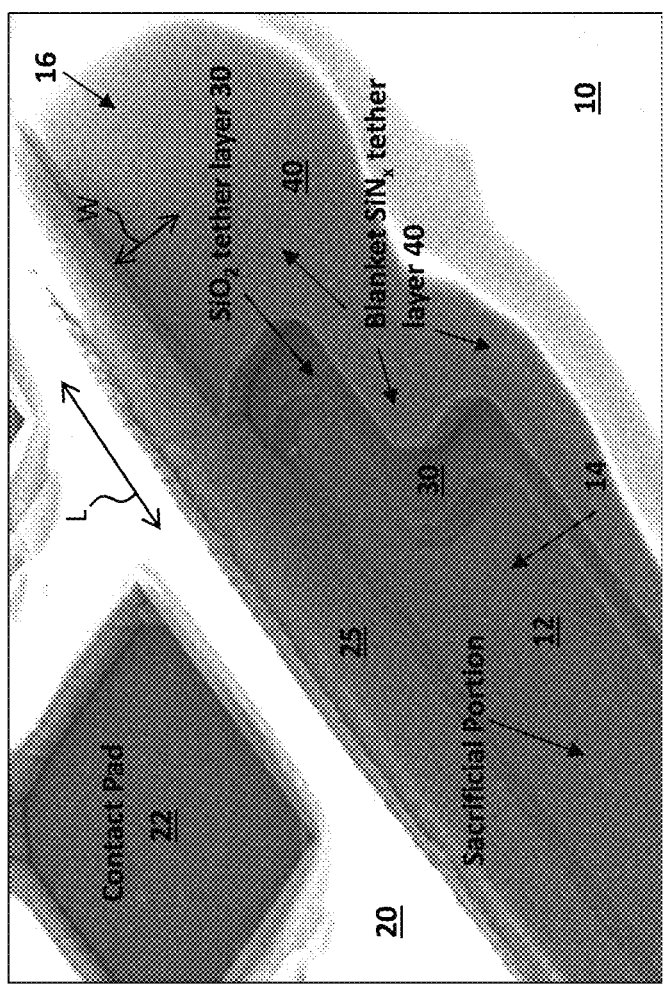
FIG. 6 is a perspective micrograph illustrating an anchor and a tether, according to illustrative embodiments of the present invention.
Figure 7:
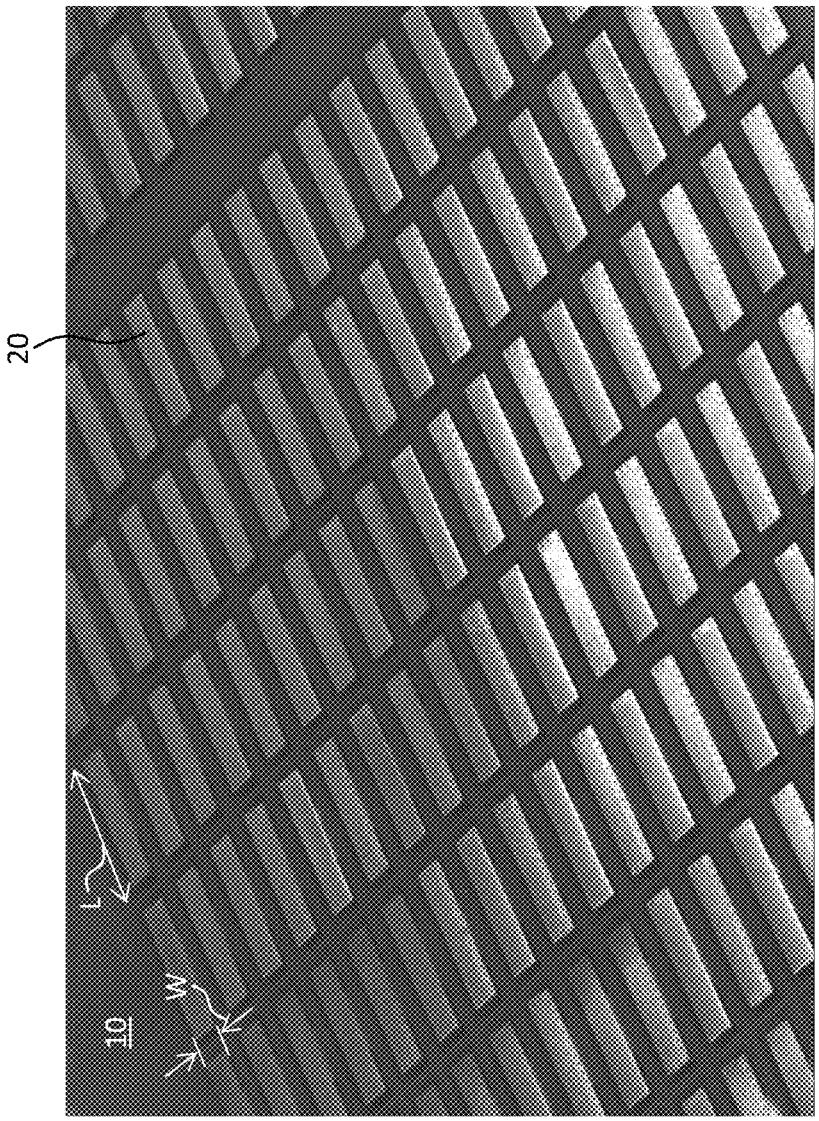
FIG. 7 is a perspective micrograph illustrating a source wafer with micro-devices, according to illustrative embodiments of the present invention.

According to embodiments of the present invention, therefore, a second tether layer 40 is deposited using different materials or different deposition methods or parameters from the first tether layer 30. Because the deposition process and materials are different, the second tether layer 40 fills in areas of the source wafer 10 that can be discontinuous and were not adequately coated with the first deposition method, as shown in FIG. 6. FIG. 6 illustrates a source wafer 10 with a bilayer tether 16 attached to an anchor 18 and comprising a first tether layer 30, and a second tether layer 40. An opening 14 exposes a part of the sacrificial portion 12, and contact pads 22 covered with the second tether layer 40. This structure corresponds to that of FIG. 3F after step 125 and before etching step 130 of FIG. 2. FIG. 6 is a micro-graph of an array of micro-devices 20 attached to a source wafer 10 (as in FIG. 5) but comprising both a first tether layer 30 and a second tether layer 40 according to some embodiments of the present invention. In FIG. 7, a micro-device 20 is found in all of the locations in the array, demonstrating the improvement in tether structures for micro-devices 20 according to certain embodiments of the present invention, and enabling micro-transfer printing with improved accuracy, precision, and consistency for all micro-devices 20 disposed on the source wafer 10.

Furthermore, certain embodiments of the present invention provide improved manufacturing efficiency and flexibility. Photolithographic patterning typically requires coating a rather viscous photoresist liquid over the surface to be patterned, exposing the liquid to a patterned mask to form a patterned layer, etching the patterned layer and an underlying layer, and then stripping (removing) the patterned layer. If micro-devices 20 are poorly attached to a source substrate 10 (for example with a single layer tether 16 consisting essentially of only a first tether layer 30) and the micro-devices 20 have been released by etching the sacrificial portion 12, the photolithographic patterning process (especially a coating process or any contact masking process) can remove or disturb the micro-devices 20 attached to the source substrate 10. Hence, patterning the first tether layer 30 to open the contact pads 22 after the micro-devices 20 have been released is problematic, as shown in FIG. 5.

If contact pads 22 are opened (e.g., exposed) before micro-devices 20 are released, an etchant used to etch sacrificial portions 12 can attack a contact pad 22 material, damaging contact pads 22 and degrading any subsequent electrical contact to micro-devices 20. In an alternative process, contact pads 22 are opened (e.g., exposed) after micro-devices 20 have been micro-transfer printed to a destination substrate, but this requires an additional process step and a much greater quantity of expensive patterning materials and more expensive photolithographic equipment (because a destination substrate is typically much larger than a source substrate 10). Moreover, removing a first or second tether layer 30, 40 after micro-devices 20 are micro-transfer printed onto the destination substrate can damage other devices on the destination substrate that are susceptible to the layer removal process (e.g., an etchant removing a first or second tether layer 30, 40 on the destination substrate could undesirably etch other devices or structures on the destination substrate or the destination substrate itself). By opening contact pads 22 before etching the sacrificial portion 12 and releasing the micro-devices 20 and using a blanket coated second tether layer 40 during the sacrificial portion 12 etch, the contact pads 22 are protected. If performed, selective removing of the blanket-coated second tether layer 40 after the etch step (130) does not require photolithographic patterning and so avoids the problems of photo-resist deposition, any contact masks, and additional etching required. Therefore, some embodiments of the present invention require fewer process steps and may utilize steps less likely to possibly cause damage.

According to some embodiments of the present invention, micro-devices 20 can be any one or more of integrated circuits, sensors, and organic or inorganic light-emitting diodes. U.S. Pat. No. 6,825,559 describes methods of making micro-transfer-printable inorganic micro-devices 20, the disclosure of which is hereby incorporated by reference.

Structures and elements in accordance with certain embodiments of the present invention can be made and assembled using micro-transfer printing methods and materials. In some embodiments, micro-devices 20 are prepared on a native source wafer 10, for example a sapphire wafer with compound semiconductors such as GaN or silicon wafers with CMOS circuits thereon, each type of micro-device 20 prepared on a different source wafer 10 and released for micro-transfer printing with one or more micro-device multi-layer tethers 16 physically connecting the micro-device sidewall 25 of each micro-device 20 to an anchor 18 of the source wafer 10. In certain embodiments, micro-devices 20 are then contacted with a micro-transfer printing stamp 50 to fracture, separate, or otherwise break micro-device tethers 16 and adhere micro-devices 20 to a transfer stamp 50. The transfer stamp 50 then contacts micro-devices 20 to a destination substrate, to which micro-devices 20 are then adhered.

For a discussion of micro-transfer printing techniques see, U.S. Pat. Nos. 8,722,458, 7,622,367 and 8,506,867, the disclosure of each of which are hereby incorporated by reference. Methods of forming micro-transfer printable structures are described, for example, in the paper *AMOLED Displays using Transfer-Printed Integrated Circuits* (Journal of the Society for Information Display, 2011, DOI #10.1889/JSID19.4.335, 1071-0922/11/1904-0335, pages 335-341) and U.S. Pat. No. 8,889,485. Micro-transfer printing using compound micro-assembly structures and methods can also be used with certain embodiments of the present invention, for example, as described in U.S. patent application Ser. No. 14/822,868, filed Aug. 10, 2015, entitled *Compound Micro-Assembly Strategies and Devices*, the disclosure of which is hereby incorporated by reference in its entirety. Additional details useful in understanding and performing certain embodiments of the present invention are described in U.S. patent application Ser. No. 14/743,981, filed Jun. 18, 2015, entitled *Micro Assembled LED Displays and Lighting Elements*, the disclosure of which is hereby incorporated by reference in its entirety.

As is understood by those skilled in the art, the terms "over", "under", "above", "below", "beneath", and "on" are relative terms and can be interchanged in reference to different orientations of the layers, elements, and substrates included in the present invention. For example, a first layer on a second layer, in some embodiments means a first layer directly on and in contact with a second layer. In other embodiments, a first layer on a second layer can include another layer there between.

Having described certain embodiments, it will now become apparent to one of skill in the art that other embodiments incorporating the concepts of the disclosure may be used. Therefore, the invention should not be limited to the described embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST

L length direction
W width direction
10 source substrate/source wafer
12 sacrificial portion
13 gap
14 opening
15 recessed portion
16 tether/multi-layer tether/bilayer tether
18 anchor
20 micro-device
21 mis-located micro-device
22 contact pad
23 absent micro-device location
25 micro-device sidewall
30 first tether layer
40 second tether layer
50 stamp
52 post
99 micro-device structure
100 provide source substrate step
105 dispose micro-device step
110 deposit first layer step
115 open contact pads and sacrificial layer opening step
120 deposit second layer step
125 pattern second layer to form sacrificial layer opening step 130 release micro-devices step
135 strip second layer step
140 micro-transfer print micro-device step

What is claimed:
1. A micro-device structure, comprising:
a source substrate comprising sacrificial portions laterally spaced apart by anchors, wherein at least a portion of each of the sacrificial portions is exposed through an opening; and
a micro-device disposed exclusively in direct contact with each of the sacrificial portions and laterally attached to one of the anchors by a multi-layer tether,
wherein the multi-layer tether comprises a first tether layer adjacent to the source substrate and a second tether layer on a side of the first tether layer opposite the source substrate, wherein (i) the first tether layer extends over at least a portion of the micro-device, (ii) the second tether layer extends over at least a portion of the micro-device, or (iii) the first tether layer extends over at least a first portion of the micro-device and the second tether layer extends over at least a second portion of the micro-device, and
wherein the first tether layer is thicker than the second tether layer.

2. The micro-device structure of claim 1, wherein the multi-layer tether is a bilayer tether consisting essentially of two tether layers.

3. The micro-device structure of claim 1, wherein the multi-layer tether comprises an oxide, a nitride, or both an oxide and a nitride.

4. The micro-device structure of claim 3, wherein the multi-layer tether comprises a first tether layer comprising silicon dioxide and a second tether layer comprising silicon nitride.

5. The micro-device structure of claim 4, wherein the first tether layer of silicon dioxide is disposed between the second tether layer of silicon nitride and the sacrificial portion.

6. The micro-device structure of claim 1, wherein the first tether layer, the second tether layer, or both the first tether layer and the second tether layer encapsulate the micro-device.

7. The micro-device structure of claim 1, wherein the micro-device comprises one or more contact pads and the first tether layer encapsulates the micro-device except for the one or more contact pads and the second tether layer encapsulates the micro-device including the one or more contact pads.

8. The micro-device structure of claim 1, wherein the first tether layer is 1.5 to 3 times as thick as the second tether layer.

9. The micro-device structure of claim 1, wherein the sacrificial portions comprise a sacrificial material that is the same material as a material of the source substrate, and wherein the sacrificial material is an anisotropically etchable material.

10. The micro-device structure of claim 1, wherein the sacrificial portions comprise a sacrificial material that is a different material from a material of the source substrate, and wherein the sacrificial material is differentially etchable from the material of the source substrate.

11. The micro-device structure of claim 1, wherein the micro-device has a thickness greater than or equal to 5 µm.

12. The micro-device structure of claim 1, wherein the micro-device has one or more of a length greater than or equal to 250 µm and a width greater than or equal to 250 µm.

13. The micro-device structure of claim 1, wherein the micro-device has at least one of a length and a width that is two to four times a length of the multi-layer tether.

14. The micro-device structure of claim 1, wherein the micro-device is laterally attached to the one of the anchors only by the multi-layer tether.

15. The micro-device structure of claim 1, wherein the micro-device is laterally attached to a second one of the anchors by a second tether.

16. A micro-device structure, comprising:
a source substrate comprising anchors that are spaced apart and recessed portions between the anchors; and
a micro-device disposed exclusively over each of the recessed portions and laterally attached to one of the anchors by a multi-layer tether, thereby defining a gap between the micro-device and the source substrate, wherein the gap is exposed through an opening,
wherein the micro-device has at least one of a length greater than or equal to 250 µm, a width greater than or equal to 250 µm, and a thickness greater than or equal to 5 µm.

17. The micro-device structure of claim 16, wherein the multi-layer tether comprises a first tether layer comprising silicon dioxide and a second tether layer comprising silicon nitride.

18. The micro-device structure of claim 16, wherein the multi-layer tether comprises a first tether layer adjacent to the source substrate and a second tether layer on a side of the first tether layer opposite the source substrate, wherein the first tether layer extends over at least a portion of the micro-device, wherein the second tether layer extends over at least a portion of the micro-device, or wherein the first tether layer extends over at least a first portion of the micro-device and the second tether layer extends over at least a second portion of the micro-device.

19. The micro-device structure of claim 18, wherein the micro-device comprises one or more contact pads and the first tether layer encapsulates the micro-device except for the one or more contact pads and the second tether layer encapsulates the micro-device including the one or more contact pads.

20. A micro-device structure, comprising:
a source substrate comprising sacrificial portions laterally spaced apart by anchors, wherein at least a portion of each of the sacrificial portions is exposed through an opening; and
a micro-device disposed exclusively in direct contact with each of the sacrificial portions and laterally attached to one of the anchors by a multi-layer tether,
wherein the multi-layer tether comprises a first tether layer adjacent to the source substrate and a second tether layer on a side of the first tether layer opposite the source substrate, and
wherein the first tether layer extends over at least a portion of the micro-device, wherein the second tether layer extends over at least a portion of the micro-device, or wherein the first tether layer extends over at least a first portion of the micro-device and the second tether layer extends over at least a second portion of the micro-device.

21. A micro-device structure, comprising:
a source substrate comprising sacrificial portions laterally spaced apart by anchors, wherein at least a portion of each of the sacrificial portions is exposed through an opening; and a micro-device disposed exclusively in direct contact with each of the sacrificial portions and laterally attached to one of the anchors by a multi-layer tether, wherein the micro-device has a thickness greater than or equal to 5 μm.

22. A micro-device structure, comprising:

a source substrate comprising sacrificial portions laterally spaced apart by anchors, wherein at least a portion of each of the sacrificial portions is exposed through an opening; and a micro-device disposed exclusively in direct contact with each of the sacrificial portions and laterally attached to one of the anchors by a multi-layer tether, wherein the micro-device has one or more of a length greater than or equal to 250 μm and a width greater than or equal to 250 μm.

23. A micro-device structure, comprising:

a source substrate comprising sacrificial portions laterally spaced apart by anchors, wherein at least a portion of each of the sacrificial portions is exposed through an opening; and a micro-device disposed exclusively in direct contact with each of the sacrificial portions and laterally attached to one of the anchors by a multi-layer tether, wherein the micro-device has at least one of a length and a width that is two to four times a length of the multi-layer tether.

24. A micro-device structure, comprising:

a source substrate comprising anchors that are spaced apart and recessed portions between the anchors; and a micro-device disposed exclusively over each of the recessed portions and laterally attached to one of the anchors by a multi-layer tether, thereby defining a gap between the micro-device and the source substrate, wherein the gap is exposed through an opening, wherein the multi-layer tether comprises a first tether layer adjacent to the source substrate and a second tether layer on a side of the first tether layer opposite the source substrate, wherein the first tether layer extends over at least a portion of the micro-device, wherein the second tether layer extends over at least a portion of the micro-device, or wherein the first tether layer extends over at least a first portion of the micro-device and the second tether layer extends over at least a second portion of the micro-device, and wherein the micro-device comprises one or more contact pads and the first tether layer encapsulates the micro-device except for the one or more contact pads and the second tether layer encapsulates the micro-device including the one or more contact pads.

* * * * *